United States Patent
Lin et al.

(10) Patent No.: US 7,105,909 B2
(45) Date of Patent: Sep. 12, 2006

(54) CONFIGURATION AND METHOD FOR MANUFACTURING FILTERS COMPRISING LC CIRCUIT

(75) Inventors: Yu Lin, Taiping (TW); Ching-Chao Wang, Pingtung (TW); Hung-Shen Chu, Hsinchu (TW)

(73) Assignee: Cyntec Company, Hsinchu (TW)

( * ) Notice: Subject to any disclaimer, the term of this patent is extended or adjusted under 35 U.S.C. 154(b) by 0 days.

(21) Appl. No.: 10/886,965

(22) Filed: Jul. 7, 2004

(65) Prior Publication Data

US 2005/0006721 A1    Jan. 13, 2005

(51) Int. Cl.
*H01L 29/00* (2006.01)
(52) U.S. Cl. ........................ 257/532; 257/703
(58) Field of Classification Search ................ 257/532, 257/701, 703
See application file for complete search history.

(56) References Cited

U.S. PATENT DOCUMENTS

| | | | | |
|---|---|---|---|---|
| 5,508,881 A | * | 4/1996 | Stevens | 361/305 |
| 5,583,359 A | * | 12/1996 | Ng et al. | 257/306 |
| 6,284,562 B1 | * | 9/2001 | Batlogg et al. | 438/99 |
| 6,486,530 B1 | * | 11/2002 | Sasagawa et al. | 257/532 |

* cited by examiner

*Primary Examiner*—Gene M. Munson
(74) *Attorney, Agent, or Firm*—Bo-In Lin

(57) ABSTRACT

A structural configuration and manufacture method is applied to manufacture electronic circuits on a ceramic substrate including capacitor and inductors for filters. The electronic circuits have strong bonding to securely adhere to the SOG-coated substrate when the SOG is cured at an elevated temperature supplemented with high nitrogen flow during the curing process. The SOG coated ceramic substrate shows excellent layer compatibilities during temperature variations because reduced differences of thermal coefficients between different layers.

8 Claims, 3 Drawing Sheets

Soft Bake: Target Temp.= 180°C

Cure

CONFIGURATION AND METHOD FOR MANUFACTURING FILTERS COMPRISING LC CIRCUIT

BACKGROUND OF THE INVENTION

1. Field of the Invention

This invention relates generally to the device configuration and processes for manufacturing circuits on ceramic surface. More particularly, this invention relates to an improved configuration and process for manufacturing electronic circuits such as filters that includes inductor and capacitor formed on a spin-on-glass (SOG) coated ceramic substrate.

2. Description of the Prior Art

For those of ordinary skill in the art, the configurations and the process of forming circuits comprising metallic traces on a ceramic surface is still faced with the difficulties that the adhesion between the metal trace and the ceramic substrate surface is unreliable and the problem of peeling off becomes a quality issue and the circuits are not able to sustain long term reliable operations. These difficulties are specially pronounced in the processes of manufacturing the filters, e.g., band pass filter and low pass filters, where inductor and capacitor are formed on a ceramic substrate and the filters are designed to operate over many temperature cycles. The difficulties arise from the facts that the ceramic substrate has a very rough surface with uneven "peak and valley" surface profile. Metal traces, particularly metal traces of fine pitches with miniaturized dimensions when formed over these "peaks and valleys" tend not to have secure attachment to the surface. Poor adhesion of the circuit on the rough surface of the ceramic substrate becomes a major difficulty that prevent the implementation of a ceramic substrate to support electronic circuits such as filters that include capacitors and inductors where the precisely controllable capacitance cannot be produced due to the rough surface and poor adhesion difficulties.

Instead of ceramic substrate, convention technologies employ a specially glaze coated substrate where a glaze of a thickness of 50 µm. The glaze coated substrate has a smooth surface that can prevent metal traces from peeling off. However, the glaze-coated substrate is significantly more expensive than a bare ceramic substrate. Furthermore, the interface between a glaze-coated substrate and a ceramic carrier is hetero-junction. Due to the difference in thermal expansion coefficients, a temperature variation leads to bending of the substrate. For the purpose of employing processing steps with temperature cycles for manufacturing circuits such as a band pass filter (BFP), the problem of substrate deformations caused by differential temperature coefficients becomes a major disadvantage.

Therefore, a need still exists in the art of design and manufacture of electronic circuits such as inductors and capacitors (LC) for filters on ceramic substrate to provide a novel and improved device configuration and manufacture processes to resolve the difficulties. It is desirable that the improved configuration and manufacturing method can provide simplified processes to achieve lower production costs, high production yield while capable of providing electronic circuits that more compact with lower profile such that the circuits supported on a ceramic substrate can be conveniently integrated into miniaturized electronic devices. It is further desirable the new and improved circuits supported on new ceramic substrate and the manufacture method can improve the production yield with simplified configuration and manufacturing processes.

SUMMARY OF THE PRESENT INVENTION

It is therefore an object of the present invention to provide a new structural configuration and manufacture method for manufacturing electronic circuits on a ceramic substrate including circuits for filters with simplified manufacturing processes to produce filters with improved bonding and adhesive characteristics between the circuits and the supporting surface to improve the product reliability such that the above mentioned difficulties can be overcome.

Specifically, this invention is an improved method to manufacture an electronic circuit by first providing a spin on glass (SOG) coated substrate that has an improved surface structure achieved by high temperature and high nitrogen flow curing. The improved SOG to surface has a crystal and surface structure that is smooth and can be strongly bonded to metal layers deposited on top of the SOG surface.

Another object of the invention is to provide an improved method to manufacture an electronic circuit by first providing a spin on glass (SOG) coated substrate wherein the SOG layer and the ceramic substrate have about the same range of expansion coefficients. The problems of substrate bending due to temperature cycles is eliminated with this new and improved substrate structure and manufacturing method.

Briefly, in a preferred embodiment, the present invention includes a metal layer supported on a ceramic substrate wherein the ceramic substrate further includes a spin-on-grass (SOG) layer deposited on top of a top surface of the ceramic substrate. In a preferred embodiment, the ceramic substrate includes a aluminum oxide substrate.

This invention discloses a method for manufacturing a filter comprising a step of coating a ceramic substrate with a SOG layer by first coating a SOG layer on a ceramic substrate followed by curing the SOG layer at a temperature around six hundred degree Celsius and higher. The method further includes a step of introducing a high nitrogen flow during the curing process.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1:
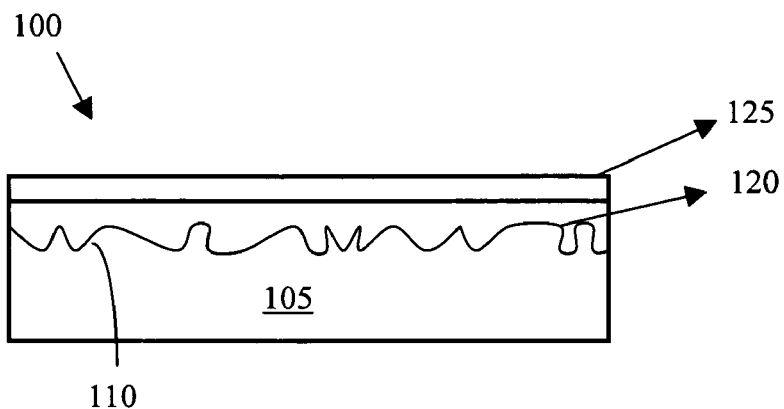
FIG. 1 shows a side cross sectional view of a ceramic substrate coated with a spin-on-glass layer according to the manufacturing processes of this invention.

FIG. 1 is a side cross sectional view of a spin-on-glass (SOG) coated ceramic substrate 100 of this invention. A preferred material of the ceramic substrate 105 is aluminum oxide ($Al_2O_3$). As shown in FIG. 1, the ceramic substrate 105 has a rough and uneven surface 110. The SOG-coated ceramic substrate 100 further includes a SOG layer 120 deposited on top of the rough surface 110 of the ceramic substrate 120 thus forming a smooth surface. A metal layer 125 is formed on top of the SOG layer 120, which is preferably a TiW layer that has a strong adhesion to the SOG layer, on top of the TiW layer, a copper layer can be deposited.

Figure 2A:
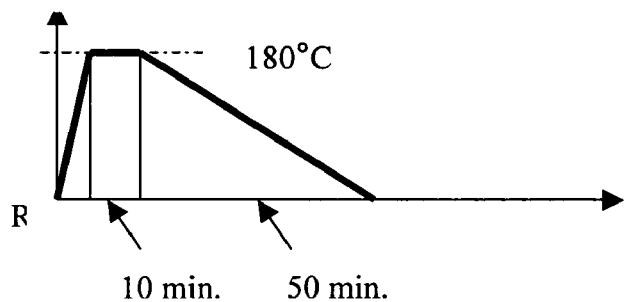
FIGS. 2A and 2B are timing diagram for showing the processing steps of a SOG coated ceramic substrate of FIG. 1.
Figure 2B:
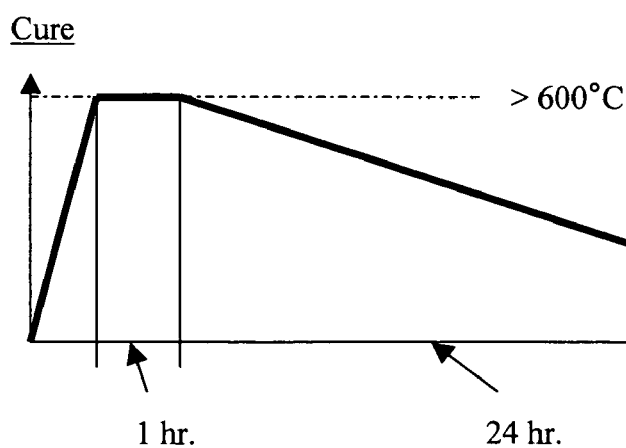

FIGS. 2A and 2B shows the temperature cycles for making the SOG-coated ceramic substrate of this invention. A bare ceramic substrate 105 is first coated with one or several layers of SOG. The sub-layer structure of the SOG layer 110 will be further described below for describing the manufacturing processes. After the SOG layer 120 is coated on top of the rough surface 110 of the ceramic substrate 105, a soft bake at a baking temperature of approximately 180 degrees Celsius is carried out for about ten minutes then cool off for fifty minutes. The SOG coated substrate is then cured at an elevated temperature around 600 to 850 degrees Celsius is carried out for one hour. In order to reduce the cracks that may occur in high temperature curing process, the high temperature curing of the SOG layer 110 is performed with a high nitrogen flow.

Figure 3:
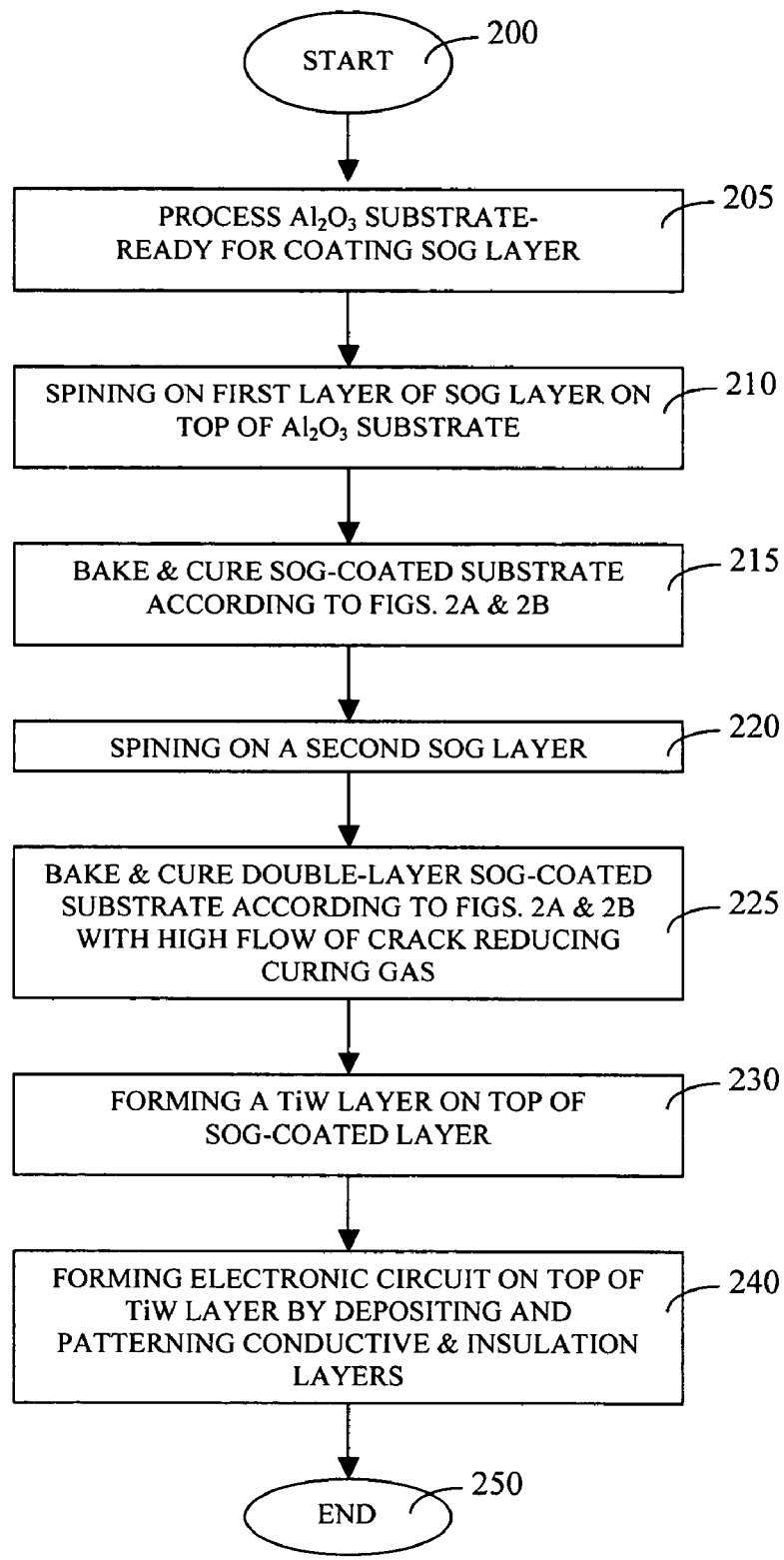
FIG. 3 is a flow chart for showing the processing steps for making the SOG coated ceramic substrate of this invention.

FIG. 3 is a flowchart for showing a processing steps for manufacturing a SOG-coated substrate of this invention. The process starts (step 200) by processing a ceramic substrate such as a aluminum oxide substrate and ready for coating a spin-on-glass (SOG) layer on the top surface (step 205). The a first layer of SOG layer, e.g., a SOG-512 or SOG-211 single coat layer is spinning onto the top surface of the top surface of the ceramic substrate (step 210), followed by a bake and curing process (step 215). The bake and curing process are carried out according to FIGS. 2A and 2B. Then a second SOG layer, e.g. a SOG-512 or SOG-211, is coated to form a double SOG coating (step 220) followed by a bake and curing process (step 225). The curing processes can be carried out with a high flow of nitrogen to prevent cracking at a high temperature curing of the SOG layer. Then a TiW layer is formed on top of the SOG layer (step 230) followed by steps to pattern and making electronic circuits supported on this SOG-coated ceramic substrate (step 240) before the manufacturing processes end (step 250).

Figure 4:
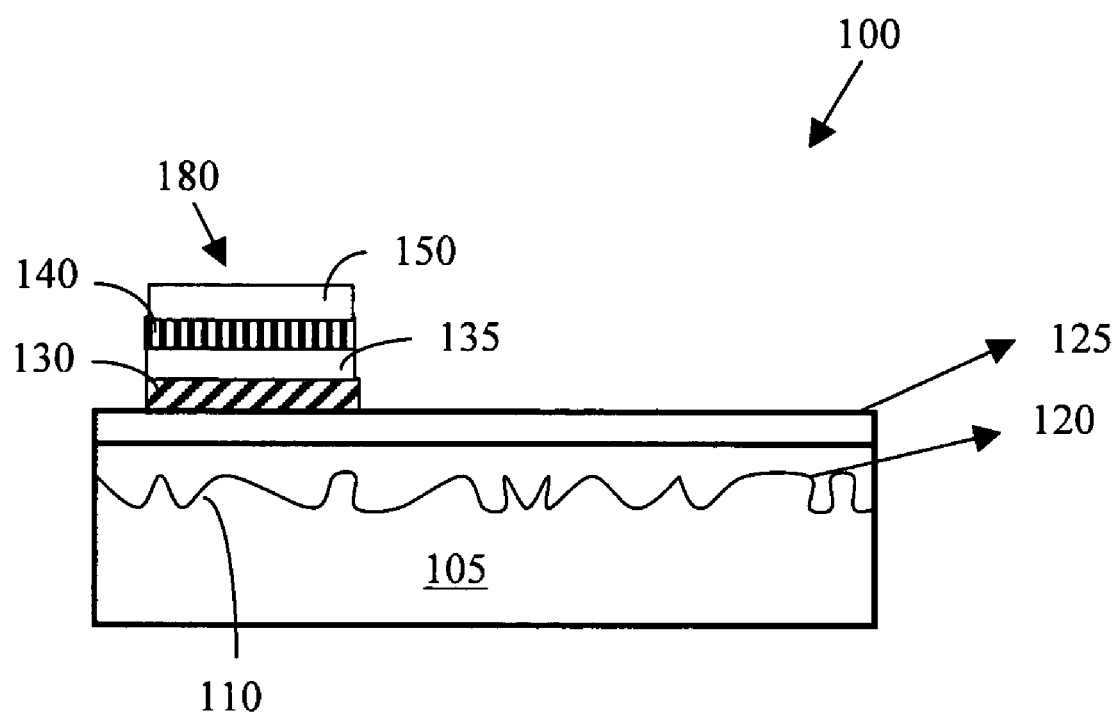
FIG. 4 is a side cross sectional view of a capacitor as part of a electronic device supported on a SOG coated ceramic substrate of this invention.

FIG. 4 is a side cross sectional view for showing a layer structure of a capacitor 180 formed on a SOG coated ceramic substrate for supporting a filter, e.g., a band-pass filter including the capacitor 180 as shown. The capacitor is supported on the ceramic substrate 105 coated with a SOG layer 120 then covered with a TiW layer 125. The capacitor includes a first cooper layer 130 formed on top of the TiW layer 125. A silicon nitride (SiNx) layer 135 is formed on top of the first copper layer 130 to function as a dielectric layer of the capacitor. Then, a TiW layer 140 and a top cooper layer 150 are formed on top of the dielectric layer 135. The capacitor 180 is formed on the SOG coated ceramic substrate 105 as part of the electronic device such as a band-pass filter of this invention.

According to FIGS. 1 to 4 and above descriptions, this invention discloses a ceramic substrate for supporting an electronic circuit thereon. The ceramic substrate further includes a spin-on-glass layer (SOG) formed on top of the ceramic substrate to form the electronic circuit thereon. In a preferred embodiment, the ceramic substrate further includes a metal layer supported on top of the SOG layer. In a preferred embodiment, the ceramic substrate comprising a aluminum oxide substrate. In another preferred embodiment, the ceramic substrate further includes a metal layer comprising TiW supported on top of the SOG layer. In another preferred embodiment, the ceramic substrate further includes a capacitor comprising a bottom metallic layer and top metal layer and a dielectric layer between the top and bottom metallic layers wherein the bottom metallic layer supported on the SOG layer. In another preferred embodiment, the bottom and top metallic layers further comprising a TiW layer. In another preferred embodiment, the bottom and top metallic layers further comprising a copper layer. In another preferred embodiment, the dielectric layer further comprises a silicon nitride layer. In another preferred embodiment, the ceramic substrate further includes a plurality of metallic layers patterned into an electronic device supported thereon. In another preferred embodiment, the metallic layers further patterned into an electronic filter supported thereon.

In a preferred embodiment, this invention further discloses a method for manufacturing a ceramic substrate for supporting an electronic circuit thereon. The method includes a step of forming a spin-on-glass layer on top of the ceramic substrate to support the electronic circuit on top of the SOG layer. In another preferred embodiment, the method further includes a step of forming a metal layer on top of the SOG layer. In another preferred embodiment, the step of forming the SOG layer is a step of forming the SOG layer on top of an aluminum oxide substrate. In another preferred embodiment, the method further includes a step of forming a metal layer comprising TiW on top of the SOG layer. In another preferred embodiment, the step of forming the SOG layer further includes a step of curing the SOG layer in an expanded temperature range above five hundred degrees Celsius. In another preferred embodiment, the step of forming the SOG layer further includes a step of curing the SOG layer in an expanded temperature range in a SOG crack-reducing gas.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A ceramic substrate for supporting an electronic circuit thereon comprising:
    a spin-on-glass (SOG) layer formed on top of said ceramic substrate to form said electronic circuit thereon; and
    a metal layer comprising TiW supported on top of said SOG layer.
2. The ceramic substrate of claim 1 wherein:
    said ceramic substrate comprising a aluminum oxide substrate.
3. The ceramic substrate of claim 1 further comprising:
    a plurality of metallic layers disposed on top of said metal layer comprising said TiW wherein said plurality of metallic layers patterned into an electronic device supported thereon.

4. A ceramic substrate for supporting an electronic circuit thereon comprising:
  a spin-on-glass (SOG) layer formed on top of said ceramic substrate to form said electronic circuit thereon; and
  a capacitor comprising a bottom metallic layer and top metal layer and a dielectric layer between said top and bottom metallic layers wherein said bottom metallic layer supported on said SOG layer.

5. The ceramic substrate of claim 4 wherein:
  said bottom and top metallic layers further comprising a TiW layer.

6. The ceramic substrate of claim 4 wherein:
  said bottom and top metallic layers further comprising a copper layer.

7. The ceramic substrate of claim 4 wherein:
  said dielectric layer further comprising a silicon nitride layer.

8. A ceramic substrate for supporting an electronic circuit thereon comprising:
  a spin-on-glass (SOG) layer formed on top of said ceramic substrate to form said electronic circuit thereon;
  a metal layer comprising TiW supported on top of said SOG layer;
  a plurality of metallic layers disposed on top of said metal layer comprising said TiW; and
  said plurality of metallic layers further patterned into an electronic filter supported thereon.

* * * * *